United States Patent
Waechter et al.

(10) Patent No.: US 11,859,310 B2
(45) Date of Patent: *Jan. 2, 2024

(54) VAPOR PHASE EPITAXY METHOD

(71) Applicant: AZUR SPACE SOLAR POWER GMBH, Heilbronn (DE)

(72) Inventors: Clemens Waechter, Lauffen am Neckar (DE); Gregor Keller, Heilbronn (DE); Daniel Fuhrmann, Heilbronn (DE)

(73) Assignee: Azur Space Solar Power GmbH, Heilbronn (DE)

(*) Notice: Subject to any disclaimer, the term of this patent is extended or adjusted under 35 U.S.C. 154(b) by 206 days.

This patent is subject to a terminal disclaimer.

(21) Appl. No.: 17/129,737

(22) Filed: Dec. 21, 2020

(65) Prior Publication Data

US 2021/0193465 A1 Jun. 24, 2021

(30) Foreign Application Priority Data

Dec. 20, 2019 (DE) ...................... 10 2019 008 929.4

(51) Int. Cl.
 *C30B 29/40* (2006.01)
 *C30B 25/14* (2006.01)
 (Continued)

(52) U.S. Cl.
 CPC .............. *C30B 29/40* (2013.01); *C30B 25/14* (2013.01); *C30B 25/165* (2013.01); *C30B 25/18* (2013.01);
 (Continued)

(58) Field of Classification Search
 CPC ................. H01L 29/06; H01L 29/0615; H01L 21/02576; H01L 21/02546;
 (Continued)

(56) References Cited

U.S. PATENT DOCUMENTS 3,224,913 A * 12/1965 Ruehrwein ....... H01L 21/02549
  438/936
3,416,047 A   12/1968 Beale et al.
  (Continued)

FOREIGN PATENT DOCUMENTS

EP   1 385 215 A2   1/2004
JP   2003133320 A * 5/2003

OTHER PUBLICATIONS (P. Modak, M. Kumar Hudait, S. Hardikar and S. B. Krupanidhi, "Structural and electrical properties of undoped GaAs grown by MOCVD," 1996 Conference on Optoelectronic and Microelectronic Materials and Devices. Proceedings, 1996, pp. 353-356, doi: 10.1109/COMMAD.1996.610143; hereafter Modak.*
(Continued)

*Primary Examiner* — Matthew L Reames
*Assistant Examiner* — Fakeha Sehar
(74) *Attorney, Agent, or Firm* — Muncy, Geissler, Olds & Lowe, P.C.

(57) ABSTRACT

A vapor phase epitaxy method of growing a III-V layer with a doping that changes from a first conductivity type to a second conductivity type on a surface of a substrate or a preceding layer in a reaction chamber from the vapor phase from an epitaxial gas flow comprising a carrier gas, at least one first precursor for an element from main group III, and at least one second precursor for an element from main group V, wherein when a first growth height is reached, a first initial doping level of the first conductivity type is set by means of a ratio of a first mass flow of the first precursor to a second mass flow of the second precursor in the epitaxial gas flow, the first initial doping level is then reduced to a second initial doping level of the first or low second conductivity type.

21 Claims, 2 Drawing Sheets

(51) Int. Cl.
*C30B 25/06* (2006.01)
*C30B 25/18* (2006.01)
*H01L 21/02* (2006.01)
*C30B 25/16* (2006.01)

(52) U.S. Cl.
CPC ...... *H01L 21/0251* (2013.01); *H01L 21/0257* (2013.01); *H01L 21/0262* (2013.01); *H01L 21/02463* (2013.01); *H01L 21/02538* (2013.01); *H01L 21/02546* (2013.01); *H01L 21/02576* (2013.01); *H01L 21/02579* (2013.01)

(58) Field of Classification Search
CPC ........... H01L 21/02579; H01L 21/0262; C23C 16/301; C30B 25/14; C30B 29/42
See application file for complete search history.

(56) References Cited

U.S. PATENT DOCUMENTS

| | | | | |
|---|---|---|---|---|
| 3,508,126 | A | | 4/1970 | Newman et al. |
| 4,045,257 | A | * | 8/1977 | Butter ............... H01L 21/02581 438/45 |
| 6,163,037 | A | * | 12/2000 | Matsumoto ............. H01L 33/02 257/97 |
| 7,033,921 | B2 | | 4/2006 | Jurgensen |
| 2002/0028565 | A1 | * | 3/2002 | Nikolaev ............... C30B 29/406 257/E31.02 |
| 2003/0213973 | A1 | * | 11/2003 | Yoshioka .......... H01L 29/66318 257/E29.189 |
| 2014/0120703 | A1 | * | 5/2014 | Iwami ............... H01L 21/02581 438/478 |
| 2019/0280613 | A1 | * | 9/2019 | Fujii ................. H01L 29/41716 |
| 2021/0189595 | A1 | * | 6/2021 | Waechter ................ C30B 29/40 |
| 2021/0193463 | A1 | * | 6/2021 | Waechter .......... H01L 21/02579 |
| 2021/0193464 | A1 | * | 6/2021 | Keller ............... H01L 21/02579 |

OTHER PUBLICATIONS

Singh, R., Baliga, B.J. (1998). P-I-N Diode. In: Cryogenic Operation of Silicon Power Devices. The Springer International Series in Engineering and Computer Science. Springer, Boston, MA. https://doi.org/10.1007/978-1-4615-5751-7_4.*

Sotoodeh, M & Khalid, Ata & Rezazadeh, AA. (2000). Empirical low-field mobility model for III-V compounds applicable in device simulation codes. Journal of Applied Physics. 87. 2890-2900. 10.1063/1.372274.*

Glew et al., "GAaAIAs/GaAs p. n-p. Heterojunction Bipolar Transistors Grown By Mocvd," J. of Crystal Growth, vol. 68, pp. 450-452 (1984).

Yuan Li, "Metalorganic Vapor Phase Heteroepitaxy of III-V Compounds on Germanium: Material Studies and Applications to Solar Cells," Thesis, Chaps. 1-3, pp. 1-35 (1995).

Schulte et al., "Controlled formation of GaAs pn junctions during hydride vapor phase epitaxy of GaAs," J. of Crystal Growth, vol. 352, pp. 253-257 (2012).

* cited by examiner

VAPOR PHASE EPITAXY METHOD

This nonprovisional application claims priority under 35 U.S.C. § 119(a) to German Patent Application No. 10 2019 008 929.4, which was filed in Germany on Dec. 20, 2019, and which is herein incorporated by reference.

BACKGROUND OF THE INVENTION

Field of the Invention

The present invention relates to a vapor phase epitaxy method.

Description of the Background Art

The most diverse vapor phase epitaxy systems, e.g., from Aixtron, for the epitaxial formation of semiconductor layers are known.

It is a common feature of the systems that the epitaxial layers are deposited or grown from the vapor phase on a substrate brought into a reaction chamber. To this end, the reaction chamber is heated and an epitaxial gas flow is introduced into the reaction chamber.

The composition of the gas flow depends on the type of layer to be grown, wherein typically precursors, such as, e.g., arsine and/or TMGa, supply the elements for the semiconductor layer to be grown and, if necessary, precursors for a dopant are also added for doping the layer. The precursors are fed into the reaction chamber by means of a carrier gas. Mass flow controllers are typically used to control the gas flow composition.

However, it should also be noted that due to the reactor history, other undesirable elements from previous processes may also still be present in the reaction chamber. This can be problematic especially for the formation of low-doped layers.

SUMMARY OF THE INVENTION

It is therefore an object of the present invention to provide a method that refines the state of the art.

According to an exemplary embodiment of the invention, a vapor phase epitaxy method is provided with the method step of growing a III-V layer with a doping that changes from a first conductivity type to a second conductivity type on a surface of a substrate or a preceding layer.

The first conductivity type is p and the second conductivity type is n.

In a reaction chamber, the III-V layer is grown from the vapor phase from an epitaxial gas flow.

The epitaxial gas flow has a carrier gas and at least one first precursor for an element from main group III and at least one second precursor for an element from main group V.

In addition, when a first growth height is reached, a first initial doping level of the first conductivity type is set by means of a ratio of a first mass flow of the first precursor to a second mass flow of the second precursor in the epitaxial gas flow and with or without the addition of a further precursor for a dopant of the first conductivity type to the epitaxial gas flow.

The first initial doping level is then abruptly reduced to a second initial doping level of the first conductivity type or set to second initial doping level of the second conductivity type of at most $1 \cdot 10^{15}$ cm$^{-3}$ by adding a third mass flow of a third precursor for a dopant of the second conductivity type to the epitaxial gas flow and/or by changing the ratio of the first mass flow to the second mass flow.

Then again, therefore, after the second initial doping level is reached, by stepwise or continuously increasing the mass flow of the third precursor and/or by stepwise or continuously changing the ratio between the first mass flow and the second mass flow, a doping of the III-V layer over a junction region layer with a growth height of at least 10 µm is changed stepwise or continuously until a target doping level of the second conductivity type is reached.

It is understood that a III-V layer can have at least one component or also multiple components of main group III, e.g., aluminum or gallium, and at least one component or multiple components of main group V, e.g., indium or arsenic or phosphorus.

Molecules that serve as the starting product for epitaxial growth are called precursors. A precursor is accordingly a molecule consisting of an element to be grown, e.g., an element from main group III or V, or a dopant, and at least one further element.

In the case of organometallic precursors in particular, e.g., TMGa, at least one further element is present, e.g., carbon, which is released during growth and acts as a dopant.

If a precursor for a dopant is added, this is referred to as active doping, whereas doping by means of the carbon of an organometallic precursor is referred to as autodoping.

The height and type of the doping of a III-V layer also depends on the quantity ratio between the main group III element and main group V element in the reaction chamber.

Depending on the type and size of the vapor phase system used, this quantity ratio within the reaction chamber fluctuates; i.e., the incoming gas flow has different V/III quantity ratios at different locations. Such fluctuations can occur in the area of a single semiconductor wafer and/or across multiple semiconductor wafers. It should be noted that the term "semiconductor wafer" also includes substrate wafers without a further layer.

It is understood that changing the mass flow or changing the ratio of two different mass flows can be equivalent to changing a corresponding partial pressure or partial pressure ratio or is basically equivalent to each quantity control/quantity change.

It is also understood that the setting of the stated doping levels occurs during the growth or that the growth is continuous and the mass flows are changed during the growth or deposition.

In this regard, the individual steps, therefore the doping jump after the setting of the first initial doping level or the continuous change up to the target doping level after the doping jump, either follow one another directly in time or they take place delayed in time, wherein with a time delay and without further changes to the epitaxial gas flow, a layer with constant doping still forms accordingly.

First, the first initial doping level of the first conductivity type is set. For example, a pregrown layer has a doping of the first conductivity type with a decreasing profile, wherein the first initial doping level is reached at the first growth height.

By changing the mass flow of the third precursor during the growth of the junction region layer, a reproducible profile can be achieved in the region of the p-n junction.

An undesirable formation of serial multiple p-n junctions on the semiconductor wafers can be reliably suppressed, as can the formation of local differences in the dopant profiles on the semiconductor wafers or between the semiconductor wafers.

A further advantage is that cross-contamination, for example, from the filling of the reactor chamber from previous epitaxial phases, can be reliably and effectively suppressed, and layers with low dopings below $5 \cdot 10^{15}$ cm$^{-3}$ and in particular p-n junctions can be reliably produced starting from a p-doping.

Starting from a constant V/III ratio during the growth of the junction region layer of at least 10 µm, the previous blocking voltages, fluctuating strongly on the semiconductor wafers, with differences of more than 100 V can be considerably reduced.

Stated differently, local doping differences on the semiconductor wafer due to fluctuations in the V/III ratio and/or due to different background dopings in the epitaxial system are reduced.

Alternatively, the preceding layer or the substrate already has a doping corresponding to the initial doping level, so that the setting when the first growth height is reached corresponds to a retention of the settings.

In a further alternative, the pregrown layer or the substrate has a higher doping, wherein the doping is reduced abruptly, stepwise, or continuously to the first initial level up to the first growth height.

The doping is then abruptly reduced, therefore, without intermediate steps and over a very low growth height, e.g., a few nanometers at most.

The target doping level is then achieved via a ramp or step, therefore, a continuous or stepwise change in the doping in the growing layer over the junction region layer.

The abrupt change in the doping as well as the continuous or stepwise change in the doping over the junction region layer take place either exclusively by increasing the mass flow of the third precursor, e.g., silane, or the quantity ratio between the elements of main group III and V, therefore, between the first and second mass flow, is also changed.

In a further alternative, the changes in the doping are brought about solely by changing the quantity ratio between the elements of main group III and V.

It is understood that all combinations are also possible or that the abrupt change in doping is independent of the ramp-shaped or step-shaped change in doping and the method can therefore be selected independently of one another.

It is also understood that the epitaxial gas flow can already have a possibly low mass flow of the third precursor also when the first initial doping level is set, wherein the presence of the dopant of the second conductivity type is compensated accordingly by means of the V/III ratio and/or the mass flow of the further precursor.

For example, $H_2$ or $N_2$ is suitable as carrier gases for the epitaxial gas flows.

Due to local differences in the V/III ratio and/or background dopings, an abrupt p-n junction can lead to very different blocking voltages across individual semiconductor wafers and/or multiple semiconductor wafers, especially with low dopings.

Due to the abrupt change at the beginning of the junction region, therefore, from a doping level that definitely still has the first conductivity type to an, e.g., very low doping level of the first or second conductivity type, and the stepwise or continuous further change into the doping region of the second conductivity type over a junction region layer with a certain layer thickness, a reproducible profile of the p-n junction can be achieved.

An advantage of the invention is thus that high dielectric strengths above 200 V can be reliably achieved in a simple and reproducible manner without special requirements for the vapor phase epitaxy system used.

An advantage of the method is that the vapor phase epitaxy method can be carried out using a low flow of the second precursor for group V. If arsine or TMGa is used in particular for the second precursor, the production costs can be significantly reduced by means of a low flow of the second precursor and the environmental friendliness of the production process can be greatly increased.

By the stepwise or continuous changing of the doping across the thickness of a junction region layer with a constant or almost constant V/III ratio of the mass flows, in contrast, a profile of the p-n junction reproducible across the entire reaction chamber is achieved on the semiconductor wafer.

The differences in the incoming gas flow only have an effect on the absolute growth depth of the junction, wherein the differences in the absolute growth depth have a smaller influence than a non-reproducible doping profile of the p-n junction on the blocking voltages achieved.

The first initial doping level of the first conductivity type can be at most $5 \cdot 10^{16}$ cm$^{-3}$ or at most $1 \cdot 10^{16}$ cm$^{-3}$.

The second initial doping level of the first conductivity type can be at most $5 \cdot 10^{15}$ cm$^{-3}$ or at most $1 \cdot 10^{15}$ cm$^{-33}$ or at most $5 \cdot 10^{14}$ cm$^{-3}$ or at most $1 \cdot 10^{14}$ cm$^{-3}$.

The target doping level of the second conductivity type can be at most $1 \cdot 10^{15}$ cm$^{-3}$ or at most $5 \cdot 10^{14}$ cm$^{-3}$ or at most $1 \cdot 10^{14}$ cm$^{-3}$.

The growth height of the junction region layer can be at least 30 µm or at least 60 µm.

The doping over the junction region layer can be changed by at most $1 \cdot 10^{13}$ cm$^{-3}$ over 5 µm of growth height.

The doping over the junction region layer can be changed in at least four steps.

The element of main group III can be gallium, and the element of main group V is arsenic, and/or the third precursor is monosilane.

In a refinement, after the target n-doping level has been reached over a growth height, a second target n-doping level is set by abruptly changing the third mass flow and/or by abruptly changing the ratio of the first mass flow to the second mass flow, wherein the second target n-doping level is greater than the target n-doping level.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
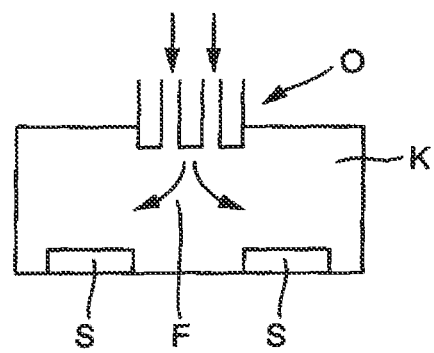
FIG. 1 shows a cross section of substrates arranged in a reaction chamber.

The illustration of FIG. 1 schematically shows a cross section of a reactor chamber K of a vapor phase epitaxy system. Substrates S are arranged on a bottom of reactor chamber K. In addition, reactor chamber K has a gas inlet member O through which epitaxial gas flow F is introduced into reactor chamber K.

The epitaxial gas flow F has a carrier gas, at least one first organometallic precursor for an element of main group III, e.g., TMGa, a second precursor for an element of main group V, e.g., arsine, and a third precursor for an n-type dopant, e.g., silane.

The gas inlet member O has a plurality of lines ending in reactor chamber K, through which one component or multiple components of epitaxial gas flow F are fed into reactor chamber K.

Figure 2:
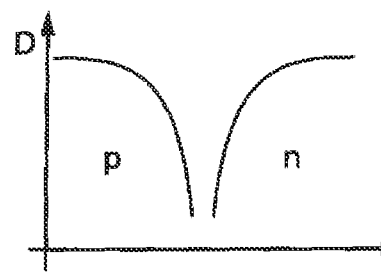
FIG. 2 shows a relationship between a doping and a ratio of elements of main group V to elements of main group III during epitaxial growth.

In the illustration of FIG. 2, the dependence of the doping on a quantity ratio of the elements of main groups V and III is plotted in a diagram. It becomes clear in particular that not only the level of doping but also the type of doping, therefore, n or p, can be set by the V/III ratio, therefore, the quantity ratio in the gas flow.

On the other hand, it becomes clear that fluctuations in the V/III ratio across a semiconductor wafer or a substrate result in different dopings and that such fluctuations have a particularly strong effect, especially at low dopings.

Figure 3:
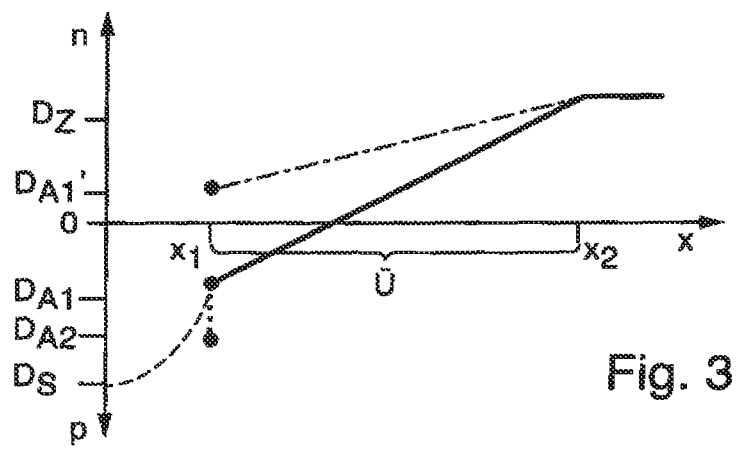
FIG. 3 shows a dopant concentration profile over a grown III-V layer according to a first embodiment of the vapor phase epitaxy method according to the invention.

An exemplary embodiment of the vapor phase epitaxy method of the invention is illustrated in the diagram in FIG. 3 using a profile of doping D versus growth height x.

First or at a first growth height $x_1$, a first initial doping level $D_{A1}$ of the first conductivity type is set by means of the ratio of a first mass flow of the first precursor, e.g., TMGa, to a second mass flow of the second precursor, e.g., arsine, in the epitaxial gas flow F, and with or without the addition of a further mass flow of a further precursor for a dopant of the first conductivity type, e.g., carbon tetrabromide or dimethyl zinc, to the epitaxial gas flow F.

A third mass flow of a third precursor for a dopant of the second conductivity type, e.g., silane, is then added and/or the ratio between the first and second mass flow is changed abruptly in order to set a second initial doping level $D_{A2}$ of the first conductivity type or (shown by dashed lines) a second initial doping level $D_{A1'}$ of the second conductivity type.

The third mass flow of the third precursor and/or the ratio between the first and second mass flow are then continuously changed over a junction region layer Ü, until a target p-doping level $D_2$ is reached at a second growth height $x_2$. It is understood that the junction region layer Ü extends from the first growth height $x_1$ to the second growth height $x_2$.

The epitaxial gas flow F is then not changed further over a further region of the growth height x, so that the doping of the subsequent III-V layer remains constant.

Figure 4:
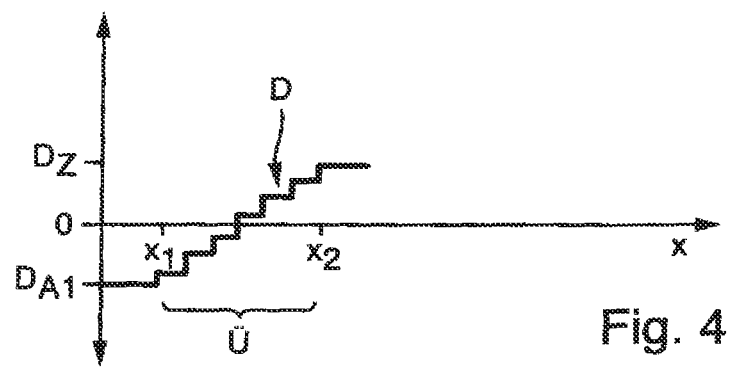
FIG. 4 shows a dopant concentration profile over a grown III-V layer according to a second embodiment of the vapor phase epitaxy method according to the invention.

In the diagram of FIG. 4, a further embodiment of the vapor phase epitaxy method of the invention is illustrated on the basis of the doping profile D, wherein only the differences from the diagram in FIG. 3 will be explained below.

The change in the doping from the initial n-doping level $D_{A1}$ to the target p-doping level $D_2$ takes place in multiple steps, so that a step-shaped profile of the doping over the junction region layer Ü is established.

Figure 5:
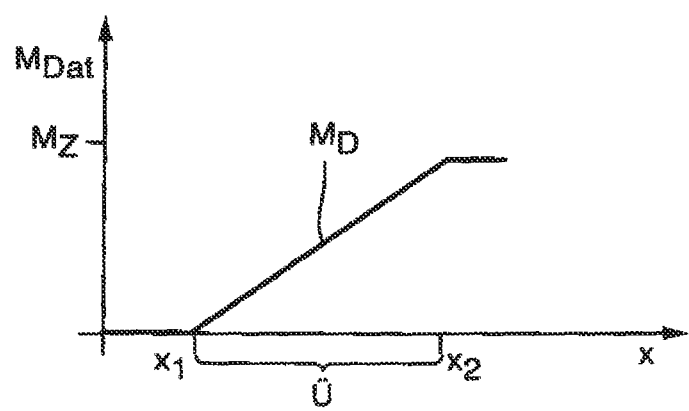
FIG. 5 shows a profile of the mass flow of the third precursor over a grown III-V layer of the vapor phase epitaxy method.

A further embodiment of the vapor phase epitaxy method of the invention based on the course of the mass flow MD over the thickness of the junction region layer Ü from the first growth height $x_1$ to the second growth height $x_2$ is illustrated in the diagram in FIG. 5, wherein only the differences from the diagram in FIG. 4 will be explained below.

The change in the mass flow MD occurs from an initial level MA which is at zero or close to zero to a target level MZ of the mass flow MZ of the third precursor. The increase in the mass flow can be carried out continuously or at least steadily; i.e., there is a straight or at least steady increase in the doping over the thickness of the junction region layer Ü. Only a linear increase in the mass flow is shown in the present case.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A vapor phase epitaxy method comprising:
   growing a III-V layer with a doping that changes from a first conductivity type to a second conductivity type in a reaction chamber from the vapor phase from an epitaxial gas flow comprising a carrier gas, at least one first precursor for an element from main group III, and at least one second precursor for an element from main group V, wherein the first conductivity type is p and the second conductivity type is n;
   during said growing the III-V layer, setting, when a first growth height is reached, a first initial doping level of the first conductivity type via a ratio of a first mass flow of the first precursor to a second mass flow of the second precursor in the epitaxial gas flow and with or without the addition of a further precursor for a dopant of the first conductivity type to the epitaxial gas flow;
   after said growth height is reached, reducing the first initial doping level to a second initial doping level of the first conductivity type or set to a second initial doping level of the second conductivity type of at most $1 \cdot 10^{15}$ cm$^{-3}$ by adding a third mass flow of a third precursor for a dopant of the second conductivity type to the epitaxial gas flow and/or by changing the ratio of the first mass flow to the second mass flow; and
   after said setting the second initial doping level of the first conductivity type or the second initial doping level of the second conductivity type, increasing, stepwise or continuously, the mass flow of the third precursor and/or by changing, stepwise or continuously, the ratio between the first mass flow and the second mass flow, a doping of the III-V layer over a junction region layer with a growth height of at least 10 μm is changed stepwise or continuously until a target doping level of the second conductivity type is reached.

2. The vapor phase epitaxy method according to claim 1, wherein the first initial doping level of the first conductivity type is at most $5 \cdot 10^{16}$ cm$^{-3}$.

3. The vapor phase epitaxy method according to claim 1, wherein the second initial doping level of the first conductivity type is at most $5 \cdot 10^{16}$ cm$^{-3}$.

4. The vapor phase epitaxy method according to claim 1, wherein the target doping level of the second conductivity type is at most $1 \cdot 10^{16}$ cm$^{-3}$.

5. The vapor phase epitaxy method according to claim 1, wherein a growth height of the junction region layer is at least 30 μm.

6. The vapor phase epitaxy method according to claim 1, wherein the doping over the junction region layer is changed in steps of at most $1 \cdot 10^{13}$ cm$^{-3}$ over 5 μm.

7. The vapor phase epitaxy method according to claim 1, wherein the doping over the junction region layer is changed in at least four steps.

8. The vapor phase epitaxy method according to claim 1, wherein the element of main group III is gallium and the element of main group V is arsenic.

9. The vapor phase epitaxy method according to claim 1, wherein the third precursor is monosilane.

10. The vapor phase epitaxy method according to claim 1, wherein, after the target doping level of the second conductivity type has been reached over a growth height, a second target n-doping level is set by abruptly changing the third mass flow and/or by abruptly changing the ratio of the first mass flow to the second mass flow, wherein the second target n-doping level is greater than the doping level of the second conductivity type.

11. The vapor phase epitaxy method according to claim 1, wherein the first initial doping level of the first conductivity type is at most $1 \cdot 10^{16}$ cm$^{-3}$.

12. The vapor phase epitaxy method according to claim 1, wherein the second initial doping level of the first conductivity type is at most $1 \cdot 10^{15}$ cm$^{-3}$.

13. The vapor phase epitaxy method according to claim 1, wherein the second initial doping level of the first conductivity type is at most $5 \cdot 10^{4}$ cm$^{-3}$.

14. The vapor phase epitaxy method according to claim 1, wherein the second initial doping level of the first conductivity type is at most $1 \cdot 10^{14}$ cm$^{-3}$.

15. The vapor phase epitaxy method according to claim 1, wherein the target doping level of the second conductivity type is at most $5 \cdot 10^{-14}$ cm$^{-3}$.

16. The vapor phase epitaxy method according to claim 1, wherein the target doping level of the second conductivity type is at most $1 \cdot 10^{-14}$ cm$^{-3}$.

17. The vapor phase epitaxy method according to claim 1, wherein a growth height of the junction region is at least 60 μm.

18. A vapor phase epitaxy method, comprising:
    growing a III-V layer with a doping that changes from a first conductivity type to a second conductivity type in a reaction chamber from the vapor phase from an epitaxial gas flow comprising a carrier gas, at least one first precursor for an element from main group III, and at least one second precursor for an element from main group V, wherein the first conductivity type is p and the second conductivity type is n; then
    setting, when a first growth height is reached, a first initial doping level of the first conductivity type via a ratio of a first mass flow of the first precursor to a second mass flow of the second precursor in the epitaxial gas flow and with or without the addition of a further precursor for a dopant of the first conductivity type to the epitaxial gas flow; then
    reducing the first initial doping level to a second initial doping level of the first conductivity type or set to a second initial doping level of the second conductivity type of at most $1 \cdot 10^{15}$ cm$^{-3}$ by adding a third mass flow of a third precursor for a dopant of the second conductivity type to the epitaxial gas flow and/or by changing the ratio of the first mass flow to the second mass flow; then
    increasing, stepwise or continuously, the mass flow of the third precursor and/or by changing, stepwise or continuously, the ratio between the first mass flow and the second mass flow, a doping of the III-V layer over a junction region layer with a growth height of at least 10 μm is changed stepwise or continuously until a target doping level of the second conductivity type is reached.

19. A vapor phase epitaxy method comprising:
    growing a III-V layer with a doping that changes from a first conductivity type to a second conductivity type in a reaction chamber from the vapor phase from an epitaxial gas flow comprising a carrier gas, a first precursor for an element from main group III, and a second precursor for an element from main group V, wherein the first conductivity type is p and the second conductivity type is n;
    during said growing the III-V layer, setting, when a first growth height is reached, a first initial doping level of the first conductivity type via a ratio of a first mass flow of the first precursor to a second mass flow of the second precursor in the epitaxial gas flow;
    after said growth height is reached, reducing the first initial doping level to a second initial doping level of the first conductivity type by changing the ratio of the first mass flow to the second mass flow; and
    increasing a mass flow of a third precursor to a level at which the doping level changes.

20. The method according to claim 19, wherein the first initial doping level is reduced to the second initial doping level of the first conductivity type by changing the ratio of the first mass flow to the second mass flow and by adding the third mass flow of the third precursor for a dopant of the second conductivity type to the epitaxial gas flow.

21. The method according to claim 19, further comprising, by changing the ratio between the first mass flow and the second mass flow, changing a doping of the III-V layer over a junction region layer with a growth height of at least 10 μm until a target doping level of the second conductivity type is reached.

* * * * *